United States Patent
Saji

(10) Patent No.: US 11,469,737 B2
(45) Date of Patent: Oct. 11, 2022

(54) ELASTIC WAVE DEVICE, HIGH-FREQUENCY FRONT-END CIRCUIT, AND COMMUNICATION APPARATUS

(71) Applicant: Murata Manufacturing Co., Ltd., Nagaokakyo (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1037 days.

(21) Appl. No.: 16/155,927

(22) Filed: Oct. 10, 2018

(65) Prior Publication Data

US 2019/0149125 A1 May 16, 2019

(30) Foreign Application Priority Data

Nov. 13, 2017 (JP) .............................. JP2017-217907

(51) Int. Cl.
| | |
|---|---|
| *H03H 9/02* | (2006.01) |
| *H03H 9/145* | (2006.01) |
| *H03H 9/17* | (2006.01) |
| *H03H 9/25* | (2006.01) |
| *H03H 9/64* | (2006.01) |

(52) U.S. Cl.
CPC ...... *H03H 9/1457* (2013.01); *H03H 9/02858* (2013.01); *H03H 9/02881* (2013.01); *H03H 9/14541* (2013.01); *H03H 9/25* (2013.01)

(58) Field of Classification Search
None
See application file for complete search history.

(56) References Cited

U.S. PATENT DOCUMENTS

| | | | |
|---|---|---|---|
| 9,431,996 B2 * | 8/2016 | Watanabe | .......... H03H 9/02834 |
| 9,780,759 B2 * | 10/2017 | Kimura | .................... H03H 3/02 |

(Continued)

FOREIGN PATENT DOCUMENTS

| | | |
|---|---|---|
| JP | 2013-518455 A | 5/2013 |
| JP | 2016-136712 A | 7/2016 |

(Continued)

OTHER PUBLICATIONS

Official Communication issued in Korean Patent Application No. 10-2018-0123123, dated Nov. 26, 2019.

*Primary Examiner* — Kenneth B Wells
(74) *Attorney, Agent, or Firm* — Keating & Bennett, LLP

(57) ABSTRACT

An elastic wave device includes a high-acoustic-velocity member, a low-acoustic-velocity film, a piezoelectric film, and am interdigital transducer electrode stacked in this order. The interdigital transducer electrode includes an intersecting region and outer edge regions. The intersecting region includes a central region located in the middle of the intersecting region in the direction in which electrode fingers extend and the inner edge regions located at the respective outer side portions of the central region. The electrode fingers in the inner edge regions have a larger thickness than in the central region. Each electrode finger has an incrased thickness portion. The increased thickness portion is made of a metal having a density d of about 5.5 g/cm³ or more and has a film thickenss equal to or smaller than a wavelength-normalized film thickness represented by T (%)=−0.1458d+ 4.8654.

20 Claims, 10 Drawing Sheets

(56) References Cited

U.S. PATENT DOCUMENTS

| | | | |
|---|---|---|---|
| 9,935,611 B2* | 4/2018 | Otagawa | H03H 9/6489 |
| 9,998,091 B2* | 6/2018 | Kikuchi | H03H 9/1092 |
| 10,256,793 B2* | 4/2019 | Takamine | H03H 9/02574 |
| 10,320,362 B2* | 6/2019 | Kikuchi | H01L 41/0475 |
| 10,396,758 B2* | 8/2019 | Saji | H04B 1/1036 |
| 10,951,192 B2* | 3/2021 | Saji | H03H 9/64 |
| 11,228,300 B2* | 1/2022 | Saji | H03H 9/25 |
| 2013/0051588 A1 | 2/2013 | Ruile et al. | |
| 2017/0093367 A1 | 3/2017 | Mimura | |
| 2018/0102761 A1 | 4/2018 | Takai et al. | |

FOREIGN PATENT DOCUMENTS

| | | |
|---|---|---|
| WO | 2015/198897 A1 | 12/2015 |
| WO | 2017/013968 A1 | 1/2017 |

* cited by examiner

ELASTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-217907 filed on Nov. 13, 2017. The entire contents of this application are hereby incorporated herein by reference.

BACKGROUND OF THE INVENTION

1. Field of the Invention

The present invention relates to an elastic wave device including a low-acoustic-velocity film and a piezoelectric film that are stacked on a high-acoustic-velocity member, a high-frequency front-end circuit, and a communication apparatus.

2. Description of the Related Art

Japanese Unexamined Patent Application Publication No. 2013-518455 discloses a structure including an intersecting region at which electrode fingers of an interdigital transducer electrode interdigitate with each other, the intersecting region including a central region disposed in the middle of the intersecting region in the direction in which the electrode fingers extend and inner edge regions disposed at the respective outer side portions of the central region. The acoustic velocity in the inner edge regions is lower than that in the central region. To form the inner edge regions, the thickness of the electrode fingers in the inner edge regions is larger than that in the central region. Outer edge regions are located at outer side portions of the inner edge regions. Japanese Unexamined Patent Application Publication No. 2013-518455 discloses that substantially the same potential can be applied to the interdigital transducer electrode, the excitation profile of a surface acoustic wave can be substantially the same as the displacement profile of the surface acoustic wave, and the effect of high-order transverse-mode ripples can be reduced rather than a fundamental mode.

As described in Japanese Unexamined Patent Application Publication No. 2013-518455, in a structure in which a piston mode is provided only by differences in acoustic velocity in the inner edge regions, the central region, and the outer edge regions, transverse-mode ripples cannot be sufficiently reduced, in some cases. Thus, resonance characteristics and filter characteristics may be degraded.

SUMMARY OF THE INVENTION

Preferred embodiments of the present invention provide elastic wave devices each including a high-acoustic-velocity member, a low-acoustic-velocity film, and a piezoelectric film that are stacked, and an interdigital transducer electrode including a central region and first and second inner edge regions disposed at the respective outer side portions of the central region, in which the filter characteristics and the resonance characteristics of the elastic wave devices are not easily degraded.

According to a preferred embodiment of the present invention, an elastic wave device includes a high-acoustic-velocity member made of a high-acoustic-velocity material, a low-acoustic-velocity film stacked on the high-acoustic-velocity member and made of a low-acoustic-velocity material, a piezoelectric film stacked on the low-acoustic-velocity film and made of lithium tantalate; and an interdigital transducer electrode diposed on the piezoelectric film, in which the high-acoustic-velocity material is a material in which an acoustic velocity of a bulk wave that propagates through the high-acoustic-velocity member is higher than an acoustic velocity of an elastic wave that propagates through the piezoelectric layer, the low-acoustic-velocity material is a material in which an acoustic velocity of a bulk wave that propagates through the low-acoustic-velocity film is lower than an acoustic velocity of an elastic wave that propagates through the piezoelectric layer, the interdigital transducer electrode includes first electrode fingers and second electrode fingers, the first electrode fingers and the second electrode fingers are interdigitated with each other, in which a region at which the first electrode fingers and the second electrode fingers intersect each other in an elastic wave propagation direction is an intersecting region, the interdigital transducer electrode includes the intersecting region and first and second outer edge regions disposed at respective outer side portions of the intersecting region in a direction in which the first electrode fingers and the second electrode fingers extend, the intersecting region includes a central region located in a middle of the intersecting region in the direction in which the first and second electrode fingers extend, and first and second inner edge regions disposed at respective outer side portions of the central region in the direction in which the first and second electrode fingers extend, the first and second electrode fingers have a larger thickness in the first and second inner edge regions than the first and second electrode fingers in the central region, each of the first and second electrode fingers has an increased thickness portion having a larger thickness than the first and second electrode fingers in the central region, and in which the increased thickness portion is made of a metal having a density d of about 5.5 g/cm$^3$ or more and a film thickenss equal to or smaller than a wavelength-normalized film thickness represented by T (%)=−0.1458d+4.8654.

In an elastic wave device according to a preferred embodiment of the present invention, preferably, the first and second electrode fingers in the first and second inner edge regions each include a first electrode and a second electrode stacked on the first electrode, in which the second electrode defines and functions as the increased thickness portion of each of the first and second electrode fingers.

In an elastic wave device according to a preferred embodiment of the present invention, the first electrode may have a duty ratio equal or substantially equal to the second electrode. In this case, the second electrode is able to be provided on the first electrode with an identical mask.

In an elastic wave device according to a preferred embodiment of the present invention, the second electrode may have a lower duty ratio than the first electrode. In this case, the tolerance of the second electrode for positional deviation in the width direction is increased when the second electrode is provided. Thus, the second electrode is able to be easily formed.

In an elastic wave device according to a preferred embodiment of the present invention, the first electrode may be mainly made of Al. In this case, the ohmic loss of the interdigital transducer electrode is reduced.

In an elastic wave device according to a preferred embodiment of the present invention, the second electrode may be made of one metal selected from the group consisting of Cu, Ta, Pt, and Au. In this case, when the second electrode is provided to increase the film thickness of the first and second inner edge regions, a sufficient band width ratio is ensured.

In an elastic wave device according to a preferred embodiment of the present invention, each of the first and second inner edge regions may have a smaller band width ratio than the central region. In this case, the resonance characteristics and the filter characteristics are more effectively improved.

In an elastic wave device according to a preferred embodiment of the present invention, an acoustic velocity in each of the first and second inner edge regions may be lower than an acoustic velocity in the central region, and an acoustic velocity in each of the first and second outer edge regions may be higher than the first and second inner edge regions.

In an elastic wave device according to a preferred embodiment of the present invention, the high-acoustic-velocity member may be a high-acoustic-vlocity supporting substrate. The elastic wave device may further include a supporting substrate that supports the high-acoustic-velocity member.

According to a preferred embodiment of the present invention, a high-frequency front-end circuit includes an elastic wave device according to a preferred embodiment of the present invention and a power amplifier.

According to a preferred embodiment of the present invention, a communication apparatus includes a high-frequency front-end circuit according to a preferred embodiment of the present invention and an RF signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the attached drawings so as to clarify the present invention.

Preferred embodiments described herein are illustrative. It should be noted that partial replacement and combination of configurations in different preferred embodiments may be made.

Figure 1:
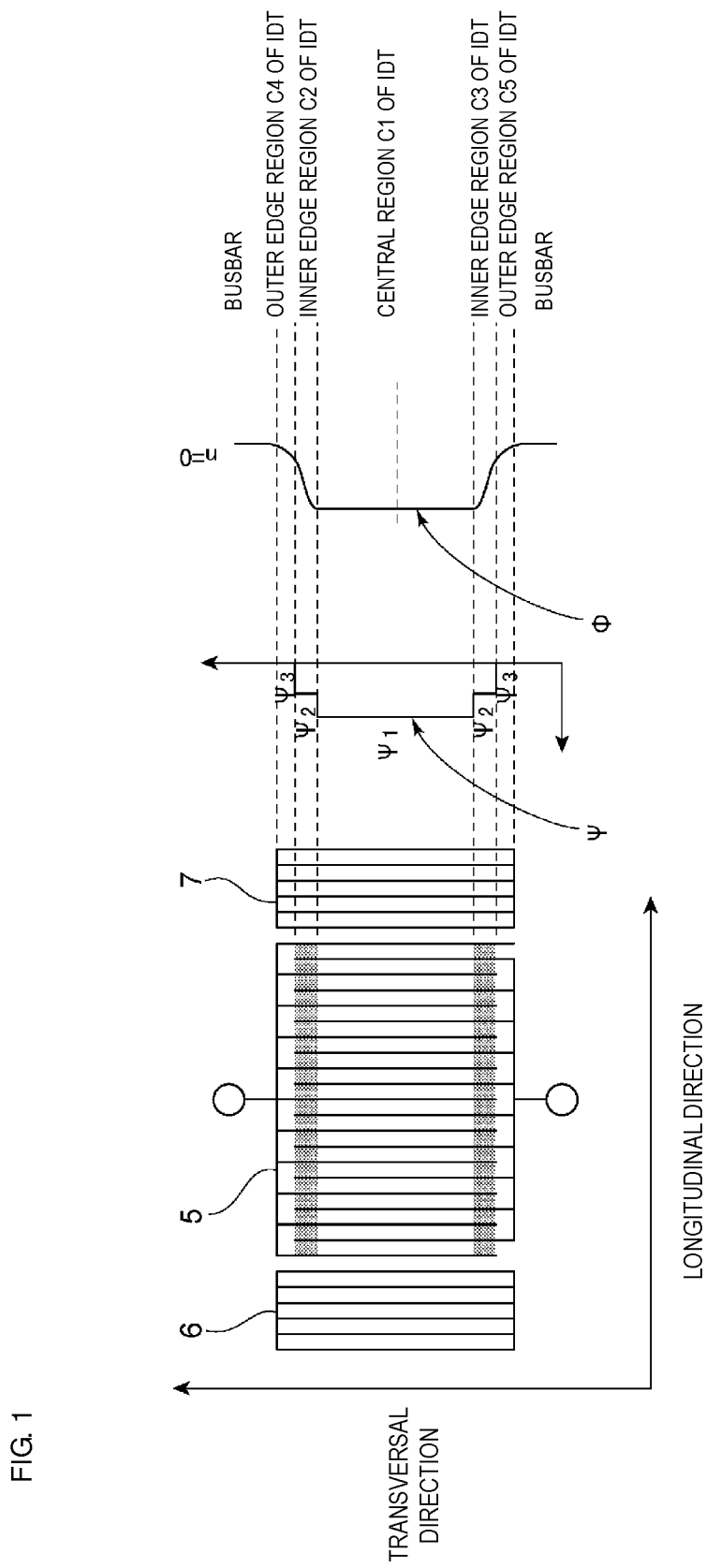
FIG. 1 schematically illustrates the excitation profile and the displacement distribution of an elastic wave device according to a first preferred embodiment of the present invention.
Figure 2:
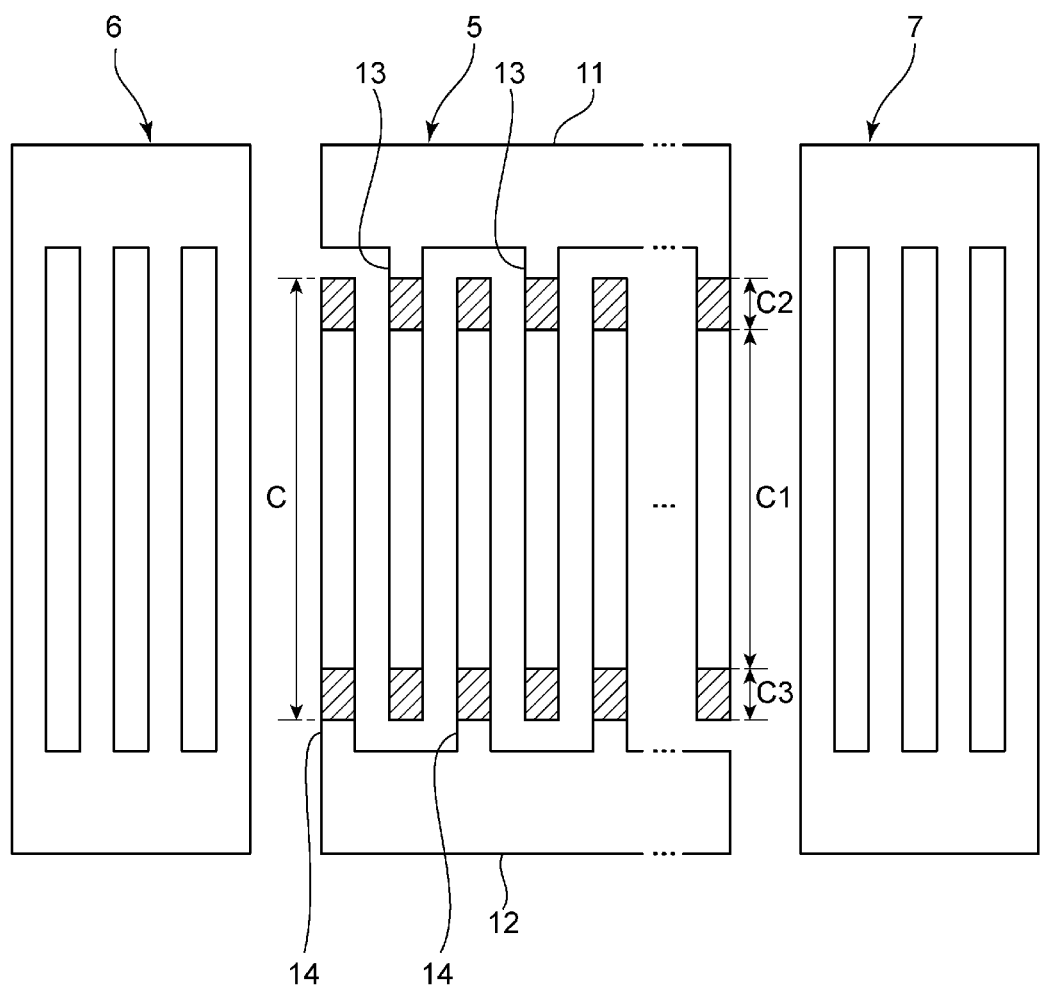
FIG. 2 is a plan view illustrating the electrode structure of the elastic wave device according to the first preferred embodiment of the present invention.
Figure 3:
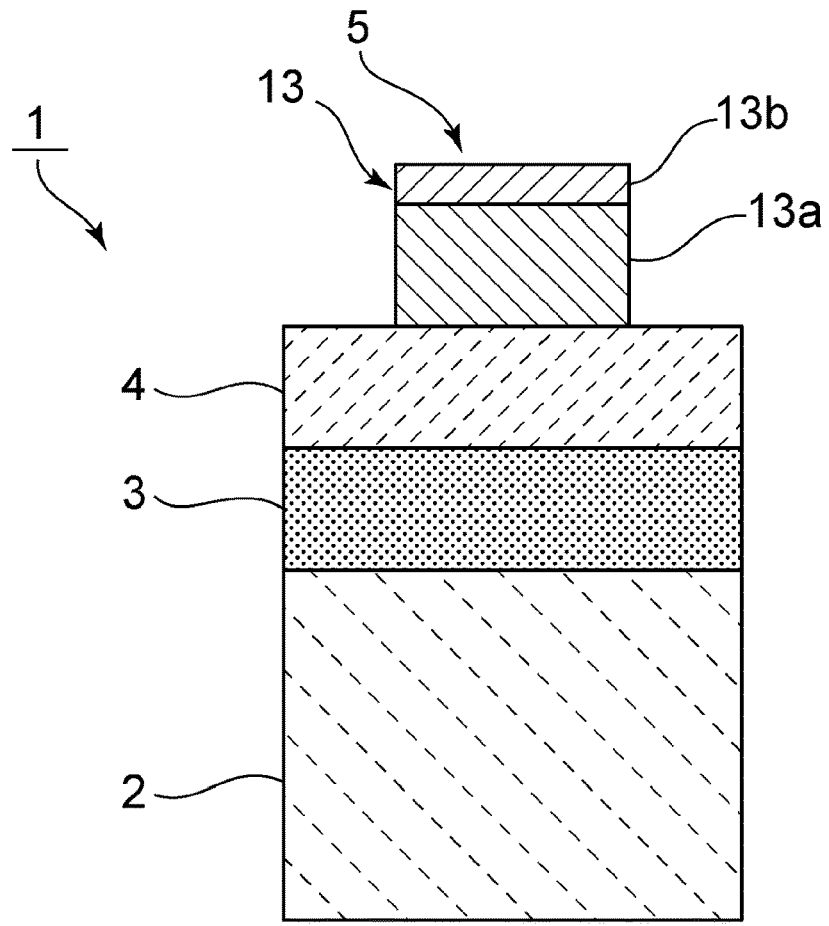
FIG. 3 is an enlarged, schematic cross-sectional view illustrating the multilayer structure of a portion of inner edge regions of the elastic wave device according to the first preferred embodiment of the present invention.

FIG. 1 schematically illustrates the excitation profile and the displacement distribution of an elastic wave device according to a first preferred embodiment of the present invention. FIG. 2 is a plan view illustrating the electrode structure of the elastic wave device according to the first preferred embodiment. FIG. 3 is an enlarged, schematic cross-sectional view illustrating the multilayer structure of a portion of inner edge regions of the elastic wave device according to the first preferred embodiment.

As illustrated in FIG. 3, a low-acoustic-velocity film and a piezoelectric film 4 are stacked on a high-acoustic-velocity member 2 in an elastic wave device 1. The high-acoustic-velocity member 2 is made of a high-acoustic-velocity material. The low-acoustic-velocity film 3 is made of a low-acoustic-velocity material. Here, the piezoelectric film 4 is preferably made of $LiTaO_3$, for example.

The high-acoustic-velocity material is referred to as a material in which the acoustic velocity of a bulk wave that propagates through the high-acoustic-velocity member 2 is higher than the acoustic velocity of an elastic wave that propagates through the piezoelectric film 4. The high-acoustic-velocity member 2 also defines and functions as a supporting substrate in the present preferred embodiment. That is, the high-acoustic-velocity member 2 is a high-acoustic-velocity supporting substrate. The high-acoustic-velocity member 2 is preferably made of, for example, silicon (Si).

The high-acoustic-velocity member is preferably made of, for example, aluminum nitride, aluminum oxide, silicon carbide, silicon nitride, silicon oxynitride, diamond-like carbon (DLC), silicon (Si), sapphire, a piezoelectric material such as lithium tantalate, lithium niobate, or quartz crystal, a ceramic material such as alumina, zirconia, cordierite, mullite, steatite, or forsterite, diamond, magnesia, a material mainly containing any of the foregoing materials, or a material mainly including any of mixtures of the foregoing materials. Any material in which an acoustic velocity is relatively high may be used for the high-acoustic-velocity material.

The low-acoustic-velocity material is referred to as "a material in which the acoustic velocity of a bulk wave that propagates through the low-acoustic-velocity film 3 is lower than the acoustic velocity of an elastic wave that propagates through the piezoelectric film 4". The low-acoustic-velocity film 3 is preferably made of silicon oxide ($SiO_2$), for example. However, for example, an inorganic insulating material or a resin material may be used as the low-acoustic-velocity material. Specifically, for example, a material preferably mainly including glass, silicon oxynitride, tantalum oxide, or a compound including a silicon oxide doped with fluorine, carbon, or boron is used. Any material in which an acoustic velocity is relatively low may be used as the low-acoustic-velocity material.

Regarding the high-acoustic-velocity material and the low-acoustic-velocity material, appropriate materials may be used in combination as long as the foregoing acoustic velocity relationship is satisfied.

The low-acoustic-velocity film 3 is stacked on the high-acoustic-velocity member 2, and the piezoelectric film 4 is disposed on the piezoelectric film 4. Thus, an elastic wave is able to be effectively confined to the piezoelectric film 4 to increase the quality factor.

An interdigital transducer electrode 5 is disposed on the piezoelectric film 4. As illustrated in FIG. 2, reflectors 6 and 7 are disposed on the respective sides of the interdigital transducer electrode 5 in an elastic wave propagation direction in the elastic wave device 1.

The interdigital transducer electrode 5 includes a first busbar 11 and a second busbar 12 facing each other. First electrode fingers 13 are connected to the first busbar 11 at base end portions thereof. Second electrode fingers 14 are connected to the second busbar 12 at base end portions thereof. The first electrode fingers 13 are interdigitated with the second electrode fingers 14.

A region in which the first electrode fingers 13 and the second electrode fingers 14 overlap one another in the elastic wave propagation direction is referred to as an "intersecting region C". The intersecting region C is a portion at which an elastic wave is excited by applying an electric field.

The first electrode fingers 13 extend toward the second busbar 12. The second electrode fingers 14 extend toward the first busbar 11.

A first outer edge region C4 and a second outer edge region C5 are disposed in the direction in which the first and second electrode fingers 13 and 14 extend, specifically, at the respective outer side portions of the intersecting region C in the direction in which the first and second electrode fingers 13 and 14 extend. An acoustic velocity in the first and second outer edge regions C4 and C5 is preferably higher than an acoustic velocity in a first inner edge region C2 and a second inner edge region C3. More specifically, the first outer edge region C4 is a gap region located between the front ends of the second electrode fingers 14 and the inner edge of the first busbar 11. The second outer edge region C5 is a gap region located between the front ends of the first electrode fingers 13 and the inner edge of the second busbar 12.

The intersecting region C includes a central region C1 located in the middle of the intersecting region C and the first and second inner edge regions C2 and C3 located at the respective outer side portions of the central region C1. The first and second inner edge regions C2 and C3 are located closer to the central region C1 than are the first and second outer edge regions C4 and C5 and, thus, are referred to as the first and second inner edge regions C2 and C3.

The first and second inner edge regions C2 and C3 are provided by increasing the thickness of the first and second electrode fingers 13 and 14. Specifically, the first and second electrode fingers 13 and 14 in the hatched regions of FIG. 2 have a larger thickness than the first and second electrode fingers 13 and 14 in the central region C1. Thus, a band width ratio in the first and second inner edge regions C2 and C3 is lower than that in the central region C1. In other words, because the band width ratio in the first and second inner edge regions C2 and C3 is lower than that in the central region C1, the excitation profile Ψ is provided. An acoustic velocity in the first and second inner edge regions C2 and C3 is lower than that in the central region C1.

More specifically, as illustrated in FIG. 3 which illustrates the first electrode fingers 13 as a representative example of a preferred embodiment of the present invention, the first electrode fingers 13 in the first and second inner edge regions C2 and C3 include first electrodes 13a and second electrodes 13b stacked on the respective first electrodes 13a. The second electrodes 13b are disposed only in the inner edge regions. That is, the second electrodes 13b are stacked in the first and second inner edge regions C2 and C3 hatched in FIG. 2. The second electrodes 13b correspond to increased thickness portions of the first and second electrode fingers 13 and 14 according to a preferred embodiment of the present invention, the increased thickness portions having a larger thickness. The second electrodes 13b are not stacked in the central region C1.

In the elastic wave device 1, the first electrodes 13a preferably have a duty ratio equal or substantially equal to the second electrodes 13b.

As described above, the first and second inner edge regions C2 and C3 are provided, and the first and second outer edge regions C4 and C5 are provided at the outer side portions of the first and second inner edge regions C2 and C3 in the direction in which the first and second electrode fingers 13 and 14 extend.

In the related art, it has been thought that transverse-mode ripples are able to be reduced by providing the first and second inner edge regions C2 and C3 in the intersecting region C and using a difference in the acoustic velocity between the first and second outer edge regions C4 and C5 located at the outer side portions of the intersecting region C.

However, the inventor of preferred embodiments of the present invention has first discovered that in the elastic wave device 1 having the structure in which the high-acoustic-velocity member 2, the low-acoustic-velocity film 3, and the piezoelectric film 4 are stacked, because transverse-mode ripples cannot be sufficiently reduced or prevented, depending on the electrode material and the film thickness of the second electrodes 13b in the first and second inner edge regions C2 and C3, the resonance characteristics are degraded.

Regarding the excitation profile Ψ of the elastic wave device 1, as illustrated in FIG. 1, the excitation intensity $\Psi_2$ in the first and second inner edge regions C2 and C3 is lower than the excitation intensity $\Psi_1$ in the central region C1. The excitation profile Ψ refers to an excitation intensity distribution in the regions.

In FIG. 1, the excitation profile Ψ is presented on the right side of the electrode structure. A displacement profile Φ in the regions in a fundamental mode is presented on the right side of the excitation profile Ψ. The displacement profile Φ illustrates a displacement distribution in the regions in the fundamental mode.

The excitation intensity $\Psi_3$ in the first and second outer edge regions C4 and C5 is preferably 0 or about 0, for example. Because the excitation profile Ψ as described above is provided, the excitation profile Ψ is close to the displacement profile Φ in the fundamental mode illustrated in FIG. 1. Thus, the transverse-mode ripples are able to be further effectively reduced or prevented.

The second electrodes 13b in the first and second inner edge regions C2 and C3 are selected so as to provide the excitation profile.

An effective coupling coefficient $k_{eff}^2$ is known as a parameter indicating the degree of matching between the excitation profile and the displacement profile. The effective coupling coefficient $k_{eff}^2$ is described in "Spurious resonance free bulk acoustic resonators", IEEE Ultrason. Symp., pp. 84-87, 2003, J. Kaitila, M. Ylilammi, J. Ella, and R. Aigner:

$$k_{eff}^2 = \frac{\left(\int u(y)E(y)dy\right)^2}{\int E^2(y)dx \cdot \int u^2(y)dy}$$

Here, u(y) corresponds to the amplitude in the intersecting width direction, i.e., the displacement profile. E(y) corresponds to the excitation intensity distribution in the intersecting width direction, i.e., the excitation profile. In an elastic wave device including an electrode structure using a piston mode in which the displacement profile and the excitation profile are matched by an acoustic velocity difference in the related art, E(y) is constant in the intersecting region and 0 or about 0 at the outer side portions of the intersecting region.

$k_{eff}^2$ may be about 0 or more and about 1 or less. When $k_{eff}^2$ is about 1, the displacement distribution is matched or similar to the excitation intensity distribution. This indicates that the materials and the structure used provide a maximum possible electromechanical coupling coefficient. When $k_{eff}^2$ is about 0, the mode is not excited.

Figure 4:
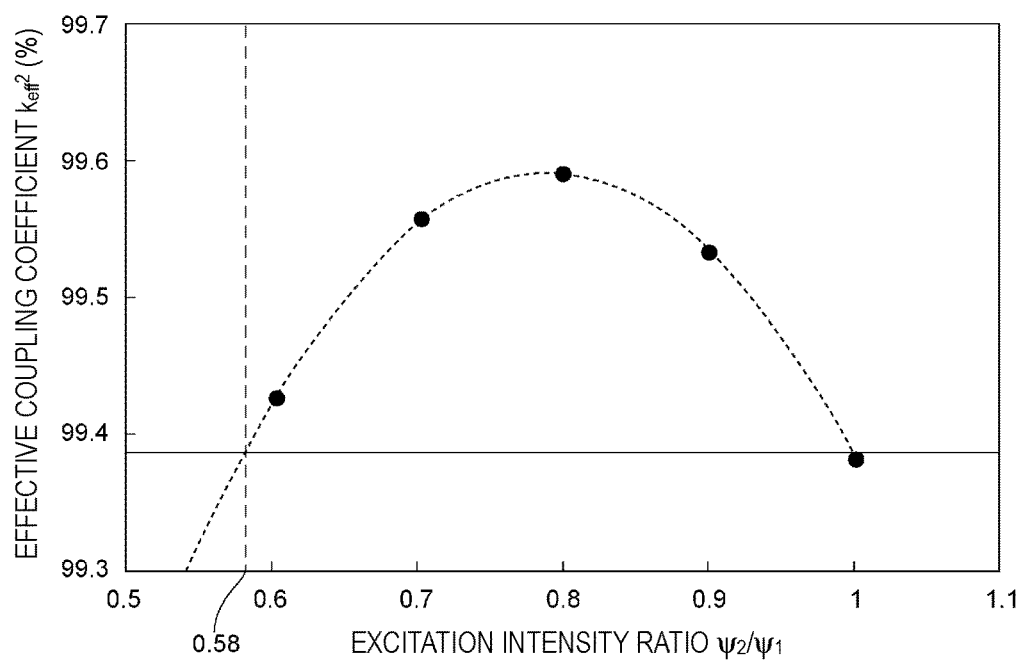
FIG. 4 illustrates the relationship between excitation intensity $\Psi_2$ in the inner edge regions/excitation intensity $\Psi_1$ in a central region and the effective coupling coefficient.

FIG. 4 illustrates the relationship between the ratio of the excitation intensity $\Psi_2$ in the first and second inner edge regions C2 and C3 to the excitation intensity $\Psi_1$ in the central region C1, i.e., $\Psi_2/\Psi_1$, and the effective coupling coefficient $k_{eff}^2$(%) in the fundamental mode.

As illustrated in FIG. 4, a reduction in the ratio $\Psi_2/\Psi_1$, i.e., $\Psi_2<\Psi_1$, is able to increase the effective coupling coefficient $k_{eff}^2$ in the fundamental mode. Preferably, when $\Psi_2/\Psi_1$ is about 0.58 or more and less than about 1, for example, the effective coupling coefficient $k_{eff}^2$ in the fundamental mode is higher than that when $\Psi_2/\Psi_1$ is about 1. This indicates that the displacement profile and the excitation profile in the fundamental mode are more closely matched to each other. Thus, higher-order transverse-mode ripples than the fundamental mode are effectively reduced or prevented.

Figure 5:
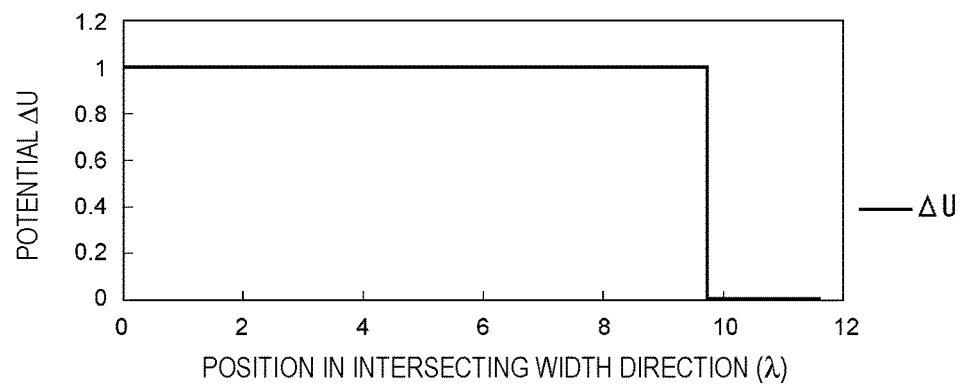
FIG. 5 illustrates the relationship between a position on an interdigital transducer electrode in the intersecting width direction and an applied potential.

FIG. 5 illustrates the relationship between a position (λ) on the interdigital transducer electrode in the intersecting width direction and a charged potential. When the position (λ) is 0 in the intersecting width direction, the position is the center of the central region C1 in the direction in which the first and second electrode fingers 13 and 14 extend. Each of the outer side portions of the intersecting region C is preferably located at a position of, for example, about 9.8λ or more in the intersecting width direction.

Figure 6:
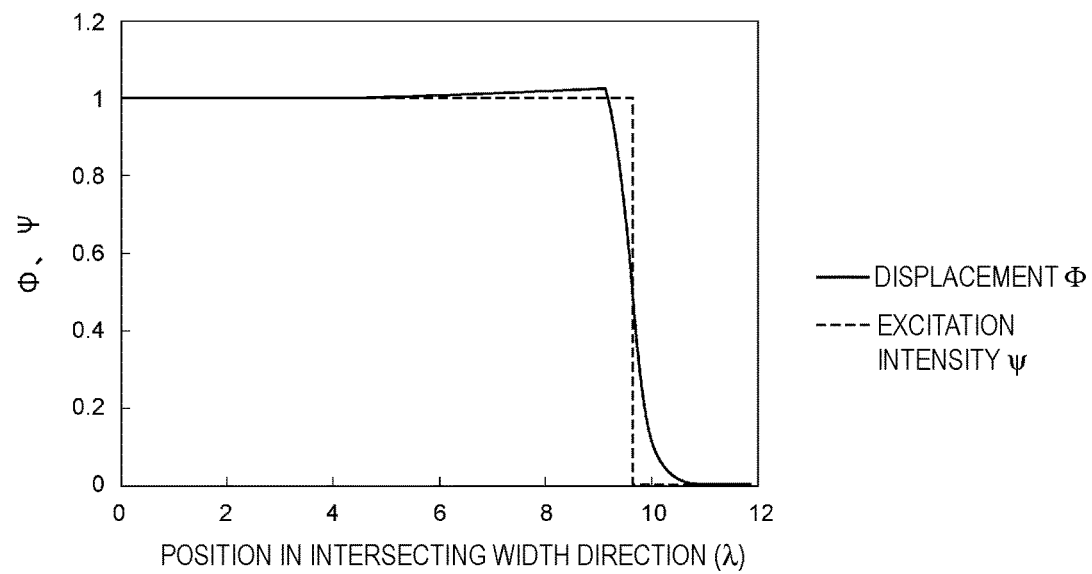
FIG. 6 schematically illustrates the relationships between a position in the intersecting width direction and displacement and between the position in the intersecting width direction and the excitation intensity in a comparative example.
Figure 7:
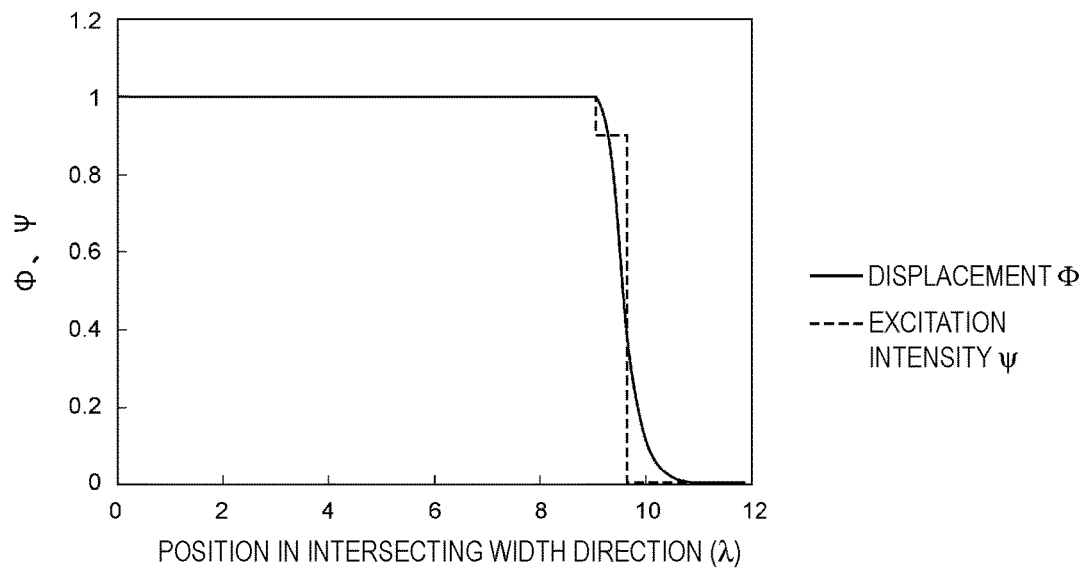
FIG. 7 schematically illustrates the relationships between a position in the intersecting width direction and displacement and between the position in the intersecting width direction and the excitation intensity in the elastic wave device according to the first preferred embodiment of the present invention.

FIG. 6 illustrates the relationships between a position in the intersecting width direction and displacement and between the position in the intersecting width direction and the excitation intensity in a comparative example. FIG. 7 illustrates the relationships between a position in the intersecting width direction and displacement and between the position in the intersecting width direction and the excitation intensity in the elastic wave device 1 according to the present preferred embodiment.

In each of FIGS. 6 and 7, a solid line indicates a displacement profile Φ, and a broken line indicates an excitation profile Ψ.

As described above, the excitation intensity $\Psi_2$ in the first and second inner edge regions C2 and C3 in the elastic wave device 1 is low. Thus, the excitation profile Ψ is close to the displacement profile Φ as illustrated in FIG. 7. In contrast, in the comparative example illustrated in FIG. 6, the excitation intensity in the inner edge regions is equal to the central region, thus resulting in a low degree of matching between the excitation profile Ψ and the displacement distribution. FIG. 7 indicates that the displacement in the central region C1 is substantially constant in the elastic wave device 1 and matched to the displacement ΔU illustrated in FIG. 5.

In the elastic wave device 1, the ratio $\Psi_2/\Psi_1$ is preferably about 0.58 or more and less than about 1, for example, in order to increase the effective coupling coefficient $k_{eff}^2$ as described above. Here, each of the excitation intensities $\Psi_2$ and $\Psi_1$ may be expressed by the band width ratio of a surface acoustic wave. In the elastic wave device 1, the ratio of the band width ratio in the first inner edge region C2 to the band width ratio in the central region C1, i.e., a normalized band width ratio, may preferably be about 0.58 or more and less than about 1, for example, by selecting the material and the film thickness of the second electrodes 13b. The first electrodes 13a are preferably, but not necessarily, a metal material mainly including Al, for example. Examples of the metal material mainly including Al include Al and alloys of Al and a metal, such as Cu, included in a smaller amount than Al.

In the elastic wave device 1, the design parameters are listed below.

High-acoustic-velocity member 2: Si substrate
Low-acoustic-velocity film 3: SiO$_2$ film having film thickness of about 673 nm
Piezoelectric film 4: LiTaO$_3$ film having thickness of about 600 nm and Euler angles of about (0°, 50°, 0°)

Interdigital transducer electrode 5:

First electrode 13a: Al film having thickness of about 145 nm

Second electrode 13b: Cu, Ta, Pt, or Au

Number of pairs of electrode fingers of interdigital transducer electrode 5: about 200 pairs Number of electrode fingers of each of reflectors 6 and 7: about 20 fingers Duty ratio of interdigital transducer electrode 5: about 0.5

Figure 9:
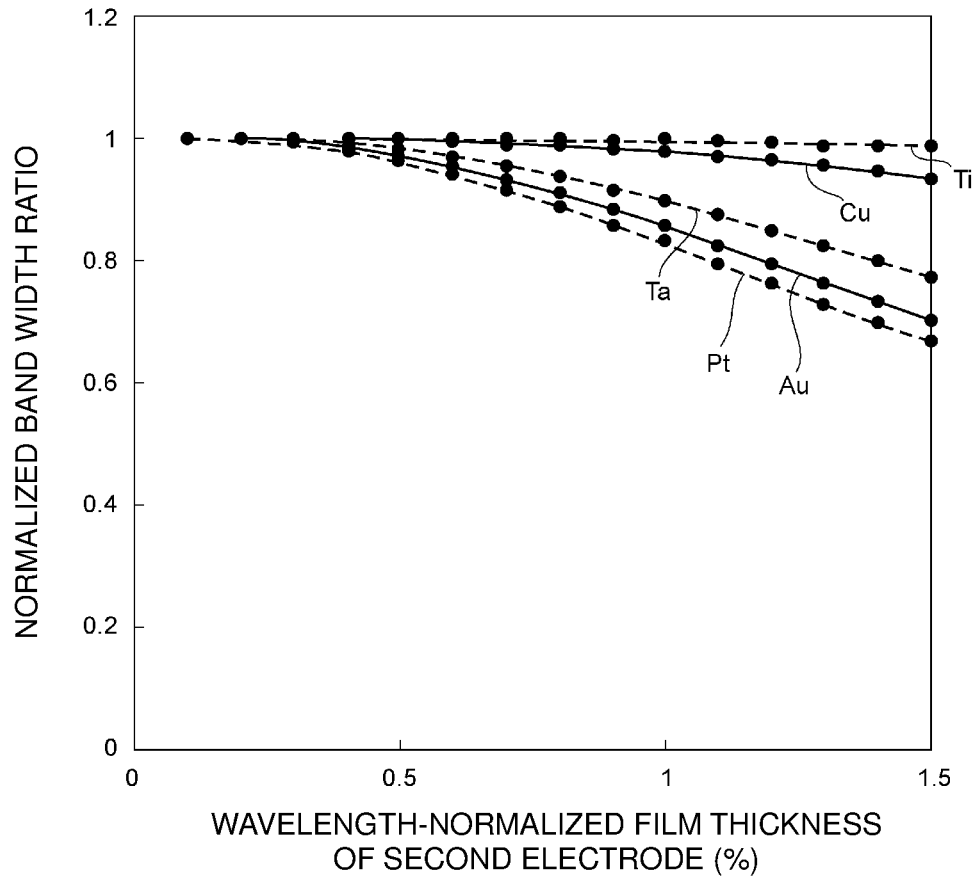
FIG. 9 illustrates the relationship between the wavelength-normalized film thickness (%) of a second electrode and the normalized band width ratio.

Wavelength λ determined by electrode finger pitch of interdigital transducer electrode 5: about 1.8 μm Regarding the elastic wave device 1, the relationship between the wavelength-normalized film thickness (%) of the second electrodes 13b and the normalized band width ratio was determined by changing the material of the second electrodes 13b and the film thickness of the second electrodes 13b. FIG. 9 illustrates the results. The normalized band width ratio is defined as the ratio of the band width ratio in the first and second inner edge regions C2 and C3 to the band width ratio in the central region C1. The normalized band width ratio increases as the excitation intensity Ψ increases.

FIG. 9 also illustrates the results of a comparative example in which the second electrodes are made of Ti.

FIG. 9 clearly indicates that in the case of the second electrodes being made of Ti, the normalized band width ratio is nearly unchanged even when the wavelength-normalized film thickness of the second electrodes 13b is changed. In contrast, in the case of the second electrodes 13b being made of Cu, Ta, Au, or Pt, a larger wavelength-normalized film thickness of the second electrodes 13b results in a lower normalized band width ratio.

The results demonstrate that when the second electrodes 13b are made of Cu, Ta, Au, or Pt, the band width ratio in the first and second inner edge regions C2 and C3 is lower than that in the central region C1. Thus, the second electrodes 13b are preferably made of one of Cu, Ta, Au, and Pt, for example. The second electrodes 13b are more preferably made of Pt, Au, or Ta, for example, because the normalized band width ratio is able to be further reduced.

Figure 8:
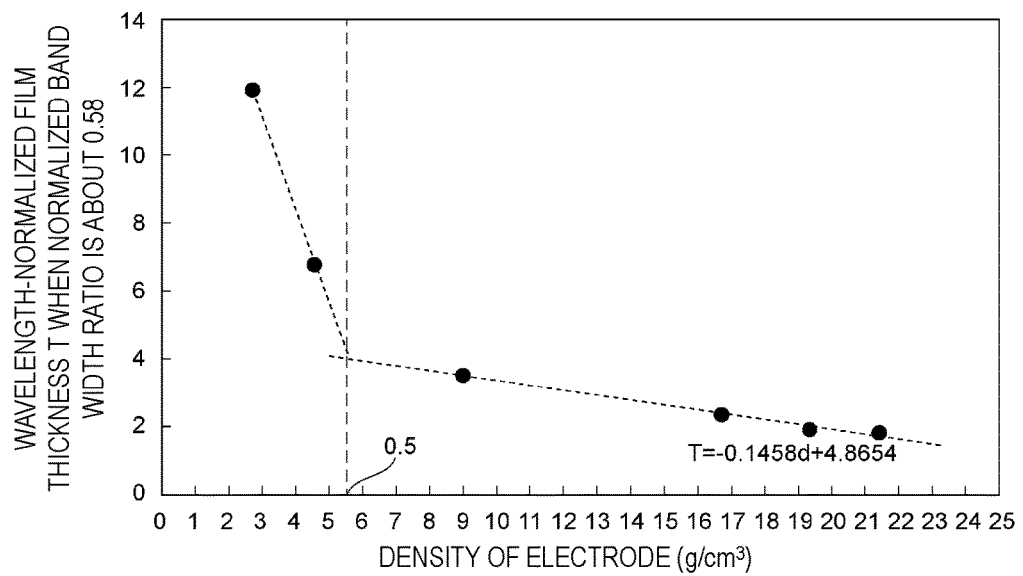
FIG. 8 illustrates the relationship between the density of the electrode and the wavelength-normalized film thickness T (%) when the normalized band width ratio is about 0.58.

Based on the foregoing results, FIG. 8 illustrates the relationship between the density of the second electrodes 13b and the wavelength-normalized film thickness T (%) when the normalized band width ratio is about 0.58.

As described above, an excitation intensity ratio $\Psi_2/\Psi_1$ of about 0.58 or more and less than about 1 results in effective reduction or prevention of the transverse-mode ripples. Thus, the transverse-mode ripples are able to be effectively reduced or prevented in a region below a straight line drawn in FIG. 8. Thus, FIG. 8 indicates that when the electrode has a density d of about 5.5 g/cm$^3$ or more, the wavelength-normalized film thickness T equal to or smaller than T=about −0.1458d+4.8654 may be used, where T represents the wavelength-normalized film thickness and d represents the density. Thus, the normalized band width ratio in the first and second inner edge regions is able to be about 0.58 or more and less than about 1.

Figure 10:
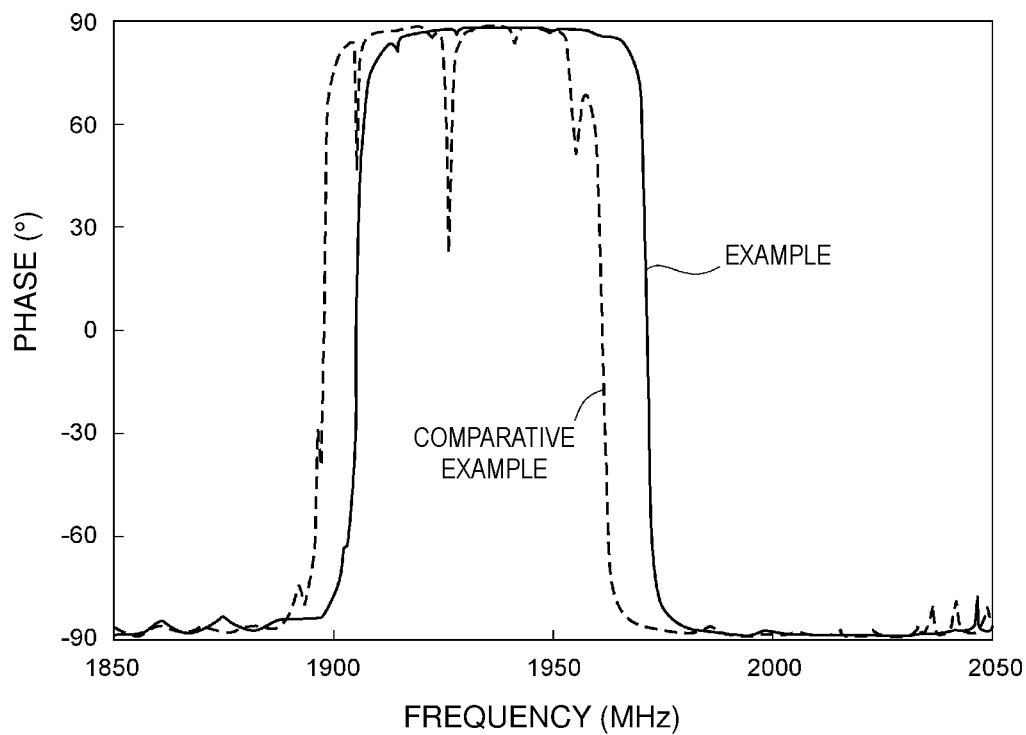
FIG. 10 illustrates the phase-frequency characteristics of elastic wave devices of an example of a preferred embodiment of the present invention and a comparative example.

FIG. 10 illustrates the phase-frequency characteristics of the elastic wave device 1 of an example of a preferred embodiment of the present invention and an elastic wave device of a comparative example. A solid line indicates the results of the example, and a broken line indicates the results of the comparative example.

In the example, the second electrodes 13b were made of Pt and had a wavelength-normalized film thickness of about 0.6%. In the comparative example, no second electrode was stacked in the first inner edge region C2 or second inner edge region C3, and the width of the first electrodes in the first and second inner edge regions C2 and C3 was larger than that in the central region.

As is clear from FIG. 10, in the elastic wave device according to the comparative example, large ripples appear in the pass band probably because of the effect of the transverse-mode ripples. In contrast, in the elastic wave device 1, no large ripples appear in the pass band. Thus, the resonance characteristics are not easily degraded.

As described above, the elastic wave device according to a preferred embodiment of the present invention includes the high-acoustic-velocity member 2, the low-acoustic-velocity film 3, and the piezoelectric film 4 that are stacked and is able to reduce or prevent the effect of the transverse-mode ripples. In a typical structure as described in the related art, the structure including an interdigital transducer electrode disposed on a piezoelectric material and including the inner edge regions, even if the thickness of the second electrodes is adjusted, the effects of preferred embodiments of the present invention are not obtained. This will be described with reference to FIG. 11.

Figure 11:
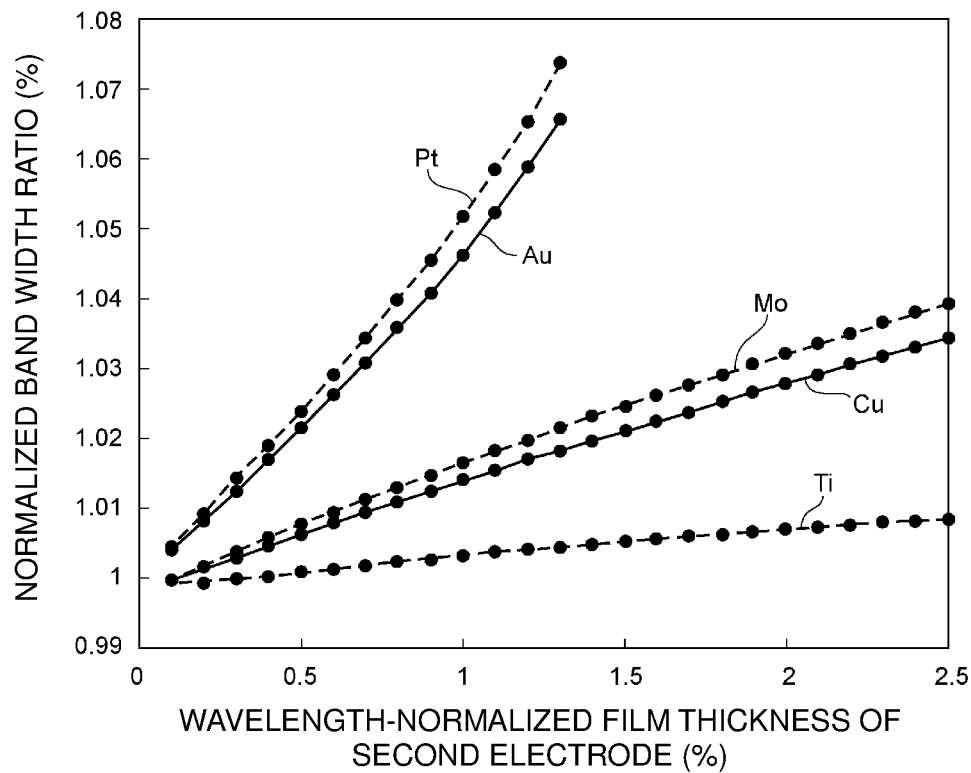
FIG. 11 illustrates the relationship between the wavelength-normalized film thickness (%) of the second electrode of an elastic wave device according to a reference example and the normalized band width ratio (%).

FIG. 11 illustrates the relationship between the wavelength-normalized film thickness of the second electrodes and the normalized band width ratio in an elastic wave device of a reference example, the elastic wave device including an interdigital transducer electrode disposed on a LiTaO$_3$ substrate and including inner edge regions provided by stacking the second electrodes on the interdigital transducer electrode.

As is clear from FIG. 11, in such an elastic wave device, when the second electrodes are made of Ti, Cu, Mo, Au, or Pt, the normalized band width ratio increases as the wavelength-normalized film thickness increases. Thus, even if the second electrodes in the inner edge regions are made of one of the materials, the excitation intensity ratio $\Psi_2/\Psi_1$ cannot be reduced.

Figure 12:
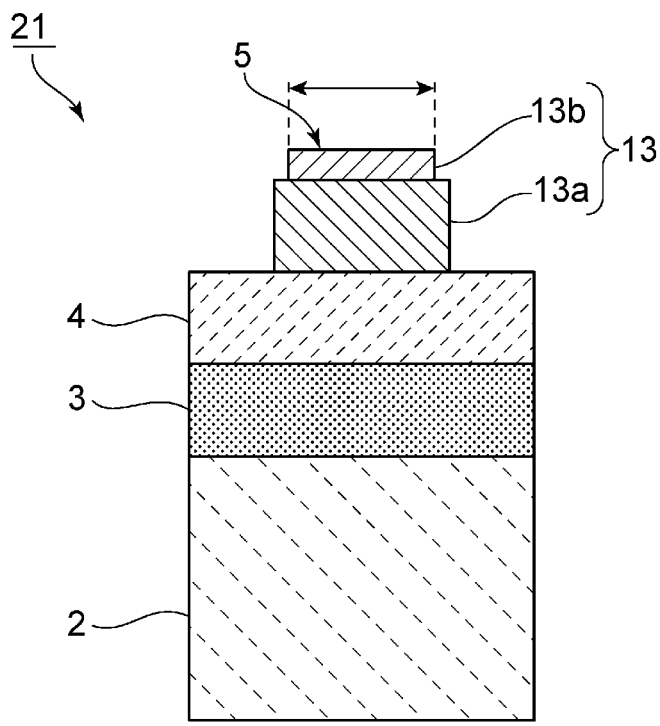
FIG. 12 is an enlarged, schematic fragmentary cross-sectional view illustrating the multilayer structure of an inner edge region of an elastic wave device according to a second preferred embodiment of the present invention.

FIG. 12 is an enlarged, schematic fragmentary cross-sectional view illustrating the multilayer structure of a portion of an inner edge region of an elastic wave device according to a second preferred embodiment of the present invention.

In an elastic wave device 21 according to the second preferred embodiment, the second electrodes 13b have a lower duty ratio than the first electrodes 13a. As described above, the second electrodes 13b used to provide the first and second inner edge regions C2 and C3 may have a lower duty ratio than the first electrodes 13a. In other words, the ratio of the duty ratio of the second electrodes 13b to the duty ratio of the first electrodes 13a may preferably be less than 1, for example. Also in this case, according to a preferred embodiment of the present invention, the transverse-mode ripples are able to be effectively reduced or prevented. This will be described with reference to FIGS. 13 to 16.

Figure 13:
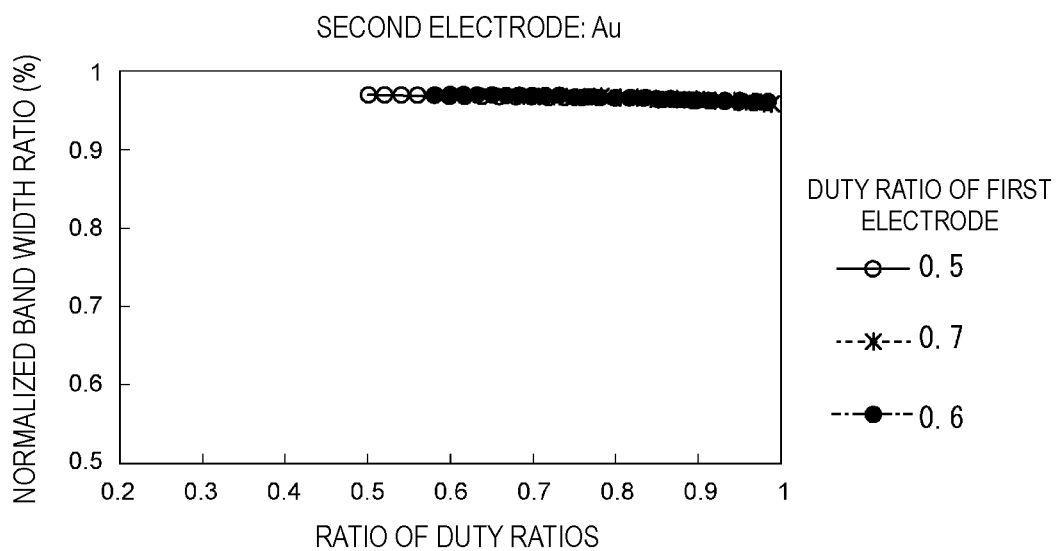
FIG. 13 illustrates, in the second preferred embodiment of the present invention, the relationship between the ratio of duty ratios when the second electrode is made of Au and the normalized band width ratio (%).
Figure 14:
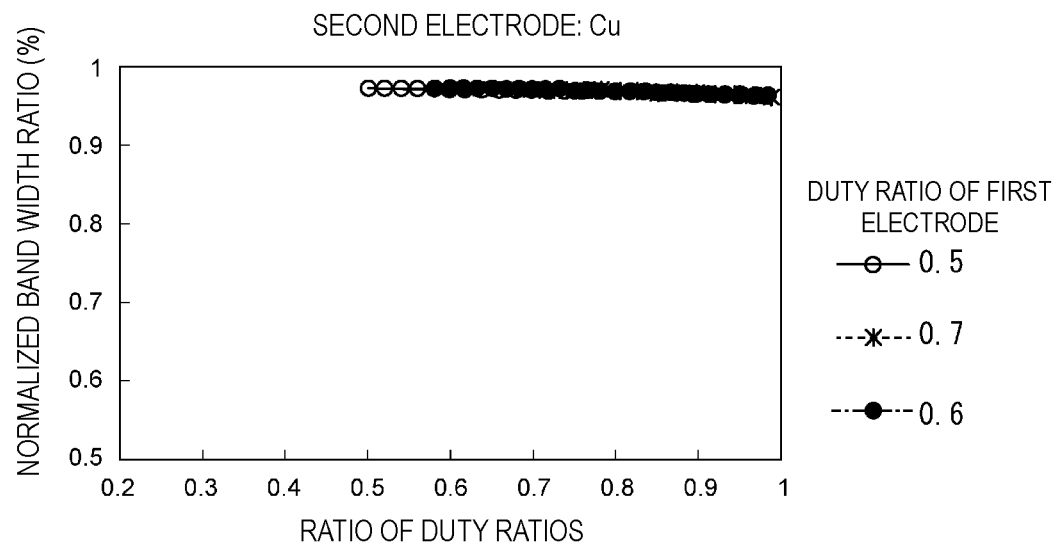
FIG. 14 illustrates, in the second preferred embodiment of the present invention, the relationship between the ratio of the duty ratios when the second electrode is made of Cu and the normalized band width ratio (%).
Figure 15:
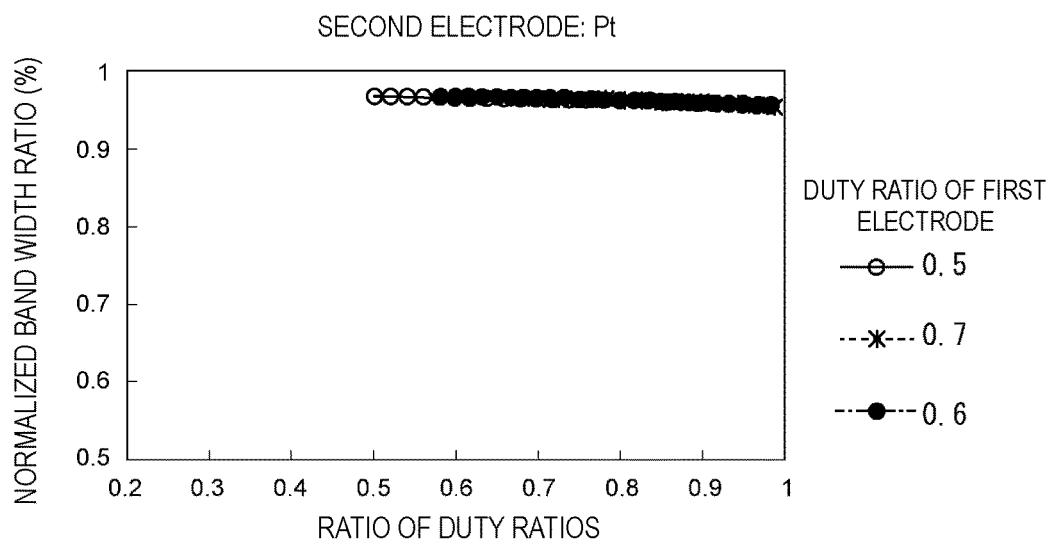
FIG. 15 illustrates, in the second preferred embodiment of the present invention, the relationship between the ratio of the duty ratios when the second electrode is made of Pt and the normalized band width ratio (%).
Figure 16:
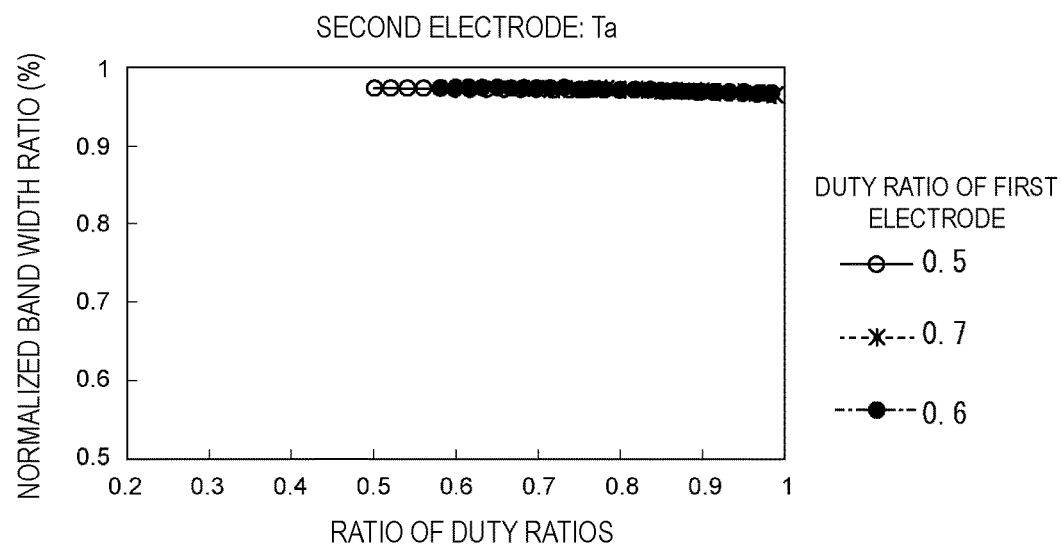
FIG. 16 illustrates, in the second preferred embodiment of the present invention, the relationship between the ratio of the duty ratios when the second electrode is made of Ta and the normalized band width ratio (%).

FIGS. 13 to 16 each illustrate the relationship between the ratio of the duty ratios and the normalized band width ratio. FIG. 13 illustrates the results when the second electrodes are made of Au. FIG. 14 illustrates the results when the second electrodes are made of Cu. FIG. 15 illustrates the results when the second electrodes are made of Pt. FIG. 16 illustrates the results when the second electrodes are made of Ta.

The ratio of the duty ratios on the horizontal axis refers to the duty ratio of the second electrodes 13b/the duty ratio of the first electrodes 13a.

As is clear from FIGS. 13 to 16, even in the case in which the first electrodes have a duty ratio of about 0.5, about 0.6, or about 0.7 and where the ratio of the duty ratios is less than about 1, the normalized band width ratio is less than about 1%. Thus, even when the ratio of the duty ratios is less than about 1, the effect of the transverse-mode ripples is able to be effectively reduced or prevented according to a preferred embodiment of the present invention.

Figure 17:
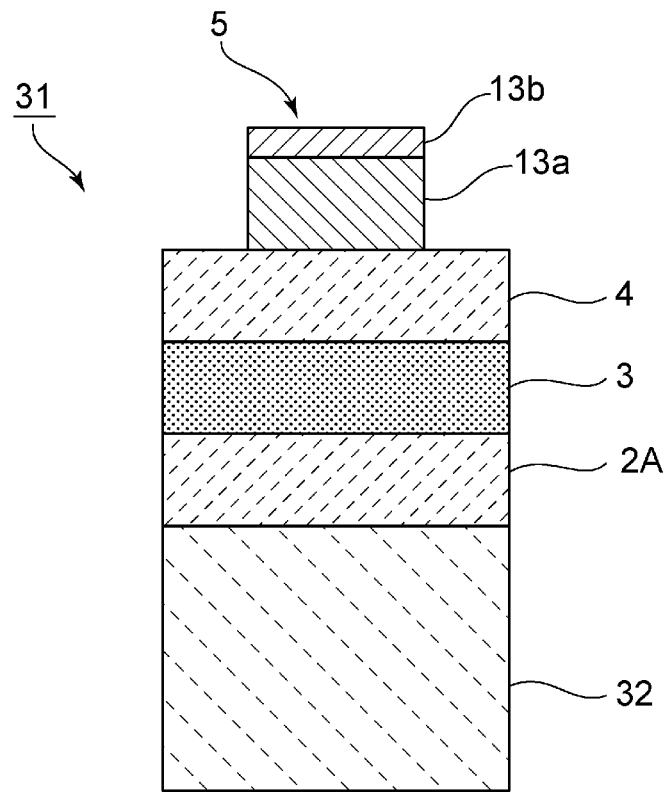
FIG. 17 is an enlarged fragmentary cross-sectional view illustrating the multilayer structure of an inner edge region of an elastic wave device according to a third preferred embodiment of the present invention.

FIG. 17 is an enlarged fragmentary cross-sectional view illustrating the multilayer structure of an inner edge region of an elastic wave device according to a third preferred embodiment of the present invention. An elastic wave device 31 according to the third preferred embodiment includes a supporting substrate 32. The supporting substrate 32 is preferably made of, for example, a semiconductor material such as silicon, aluminum nitride, aluminum oxide, silicon carbide, silicon nitride, silicon oxynitride, sapphire, a piezoelectric material such as lithium tantalate, lithium niobate, or quartz crystal, a ceramic material such as alumina, zirconia, cordierite, mullite, steatite, or forsterite, diamond, magnesia, a material mainly including any of the foregoing materials, or a material mainly including any of mixtures of the foregoing materials.

A high-acoustic-velocity film defining and functioning as a high-acoustic-velocity member 2A is stacked on the supporting substrate 32. The high-acoustic-velocity film is made of a high-acoustic-velocity material. The elastic wave device 31 has the same or substantially the same structure as the elastic wave device 1, except that the multilayer structure of the supporting substrate 32 and the high-acoustic-velocity member 2A is provided in place of the high-acoustic-velocity member 2 illustrated in FIG. 3. In this case, as with the elastic wave device 1, the effect of the transverse-mode ripples is able to be effectively reduced or prevented, so that the resonance characteristics and the filter characteristics are not easily degraded.

While one-port elastic wave resonators have been described in the foregoing preferred embodiments, preferred embodiments of the present invention may also be used for elastic wave devices having other electrode structures, such as, for example, longitudinally coupled resonator filters.

The elastic wave devices according to the foregoing preferred embodiments may be used for, for example, duplexers in high-frequency front-end circuits. Such a preferred embodiment of the present invention will be described below.

Figure 18:
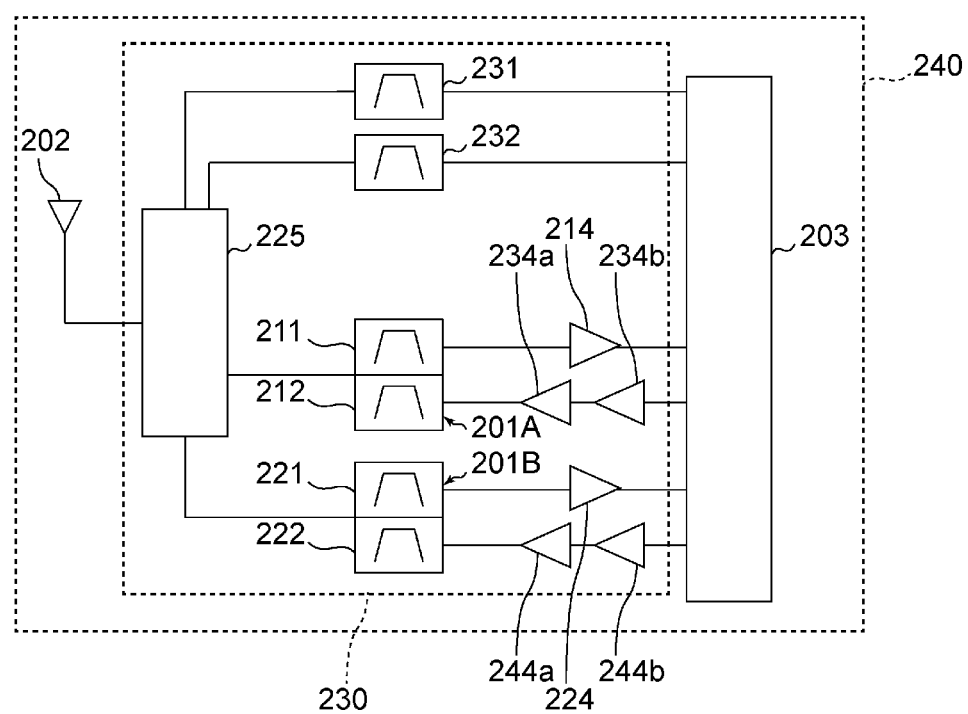
FIG. 18 is a schematic diagram of a communication apparatus including a high-frequency front-end circuit.

FIG. 18 is a schematic diagram of a communication apparatus and a high-frequency front-end circuit. FIG. 18 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 18 are examples of high-frequency front-end circuits and the communication apparatuses according to preferred embodiments of the present invention. The high-frequency front-end circuit and the communication apparatus are not limited to the configuration.

The duplexer 201A includes filters 211 and 212. The duplexer 201B includes filters 221 and 222. The duplexers 201A and 201B are connected to the antenna element 202 via the switch 225. Elastic wave devices according to a preferred embodiment described above may be used for the duplexers 201A and 201B or may be used for the filters 211, 212, 221, and 222.

Elastic wave devices according to a preferred embodiment described above may be used for multiplexers each including three or more filters, for example, triplexers each including three filters that share a common antenna terminal and hexaplexers including six filters that share a common antenna terminal.

Examples of the elastic wave devices according to preferred embodiments of the present invention include elastic wave resonators, filters, duplexers, and multiplexers each including three or more filters. The configuration of each of the multiplexers is not limited to a configuration including both of a transmitting filter and a receiving filter. Each multiplexer may include only a transmitting filter or only a receiving filter.

The switch 225 connects the antenna element 202 to at least one signal path corresponding to a predetermined band in response to a control signal from a controller (not illustrated), and may preferably include, for example, a single-pole double-throw (SPDT) switch. The at least one signal path connected to the antenna element 202 may be a plurality of signal paths. That is, the high-frequency front-end circuit 230 may support carrier aggregation.

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing, such as down-conversion, for example, and feeds a reception signal generated by the signal processing. The RF signal integrated circuit 203 allows a transmission signal fed thereto to be subjected to signal processing such as up-conversion and feeds a high-frequency transmission signal generated by the signal processing to the power amplifier circuits 234a, 234b, 244a, and 244b. The RF signal integrated circuit 203 is preferably, for example, an RFIC. The communication apparatus may preferably include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are preferably, for example, an image signal and an audio signal.

The high-frequency front-end circuit 230 may include duplexers according to a modification of the duplexers 201A and 201B, in place of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

The elastic wave devices, the high-frequency front-end circuits, and the communication apparatuses according to preferred embodiments of the present invention have been described. The present invention includes other preferred embodiments provided by combinations of the elements in the preferred embodiments described above, modifications obtained by various modifications of the foregoing preferred embodiments conceived by those skilled in the art without departing from the gist of the present invention, and various devices including the high-frequency front-end circuits and the communication apparatuses according to preferred embodiments of the present invention.

Preferred embodiments of the present invention can be widely used in communication devices, such as cellular phones, as elastic wave resonators, filters, duplexers, multiplexers that may be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a high-acoustic-velocity member made of a high-acoustic-velocity material;
   a low-acoustic-velocity film stacked on the high-acoustic-velocity member and made of a low-acoustic-velocity material;
   a piezoelectric film stacked on the low-acoustic-velocity film and made of lithium tantalate; and
   an interdigital transducer electrode diposed on the piezoelectric film; wherein
   the high-acoustic-velocity material is a material in which an acoustic velocity of a bulk wave that propagates through the high-acoustic-velocity member is higher than an acoustic velocity of an elastic wave that propagates through the piezoelectric layer;
   the low-acoustic-velocity material is a material in which an acoustic velocity of a bulk wave that propagates through the low-acoustic-velocity film is lower than an acoustic velocity of an elastic wave that propagates through the piezoelectric layer;
   the interdigital transducer electrode includes:
      first electrode fingers; and
      second electrode fingers;
   the first electrode fingers and the second electrode fingers interdigitate with each other;
   a region where the first electrode fingers and the second electrode fingers intersect each other in an elastic wave propagation direction is an intersecting region;
   the interdigital transducer electrode includes:
      the intersecting region; and
      first and second outer edge regions disposed at respective outer side portions of the intersecting region in a direction in which the first electrode fingers and the second electrode fingers extend;
   the intersecting region includes:
      a central region located in a middle of the intersecting region in the direction in which the first and second electrode fingers extend; and
      first and second inner edge regions disposed at respective outer side portions of the central region in the direction in which the first and second electrode fingers extend;
   the first and second electrode fingers in the first and second inner edge regions have a larger thickness than the first and second electrode fingers in the central region;
   each of the first and second electrode fingers has an increased thickness portion having a larger thickness than the first and second electrode fingers in the central region; and
   the increased thickness portion is made of a metal having a density d of about 5.5 g/cm$^3$ or more and has a film thickness equal to or smaller than a wavelength-normalized film thickness represented by T (%)=−0.1458d+4.8654.

2. The elastic wave device according to claim 1, wherein the first and second electrode fingers in the first and second inner edge regions each include:
   a first electrode; and
   a second electrode stacked on the first electrode; and
   the second electrode defines and functions as the increased thickness portion of each of the first and second electrode fingers.

3. The elastic wave device according to claim 2, wherein the first electrode has a duty ratio equal or substantially equal to that of the second electrode.

4. The elastic wave device according to claim 2, wherein the second electrode has a lower duty ratio than that of the first electrode.

5. The elastic wave device according to claim 1, wherein the first electrode is mainly made of Al.

6. The elastic wave device according to claim 1, wherein the second electrode is made of one metal selected from the group consisting of Cu, Ta, Pt, and Au.

7. The elastic wave device according to claim 1, wherein each of the first and second inner edge regions has a smaller band width ratio than that of the central region.

8. The elastic wave device according to claim 1, wherein an acoustic velocity in each of the first and second inner edge regions is lower than an acoustic velocity in the central region; and
   an acoustic velocity in each of the first and second outer edge regions is higher than that in the first and second inner edge regions.

9. The elastic wave device according to claim 1, wherein the high-acoustic-velocity member is a high-acoustic-vlocity supporting substrate.

10. The elastic wave device according to claim 1, further comprising:
    a supporting substrate that supports the high-acoustic-velocity member.

11. A high-frequency front-end circuit comprising:
    the elastic wave device according to claim 1; and
    a power amplifier.

12. The high-frequency front-end circuit according to claim 11, wherein the first and second electrode fingers in the first and second inner edge regions each include:
a first electrode; and
a second electrode stacked on the first electrode; and
the second electrode defines and functions as the increased thickness portion of each of the first and second electrode fingers.

13. The high-frequency front-end circuit according to claim 12, wherein the first electrode has a duty ratio equal or substantially equal to that of othe second electrode.

14. The high-frequency front-end circuit according to claim 12, wherein the second electrode has a lower duty ratio than that of the first electrode.

15. The high-frequency front-end circuit according to claim 11, wherein the first electrode is mainly made of Al.

16. The high-frequency front-end circuit according to claim 11, wherein the second electrode is made of one metal selected from the group consisting of Cu, Ta, Pt, and Au.

17. The high-frequency front-end circuit according to claim 11, wherein each of the first and second inner edge regions has a smaller band width ratio than that of the central region.

18. The high-frequency front-end circuit according to claim 11, wherein
an acoustic velocity in each of the first and second inner edge regions is lower than an acoustic velocity in the central region; and
an acoustic velocity in each of the first and second outer edge regions is higher than that in the first and second inner edge regions.

19. The high-frequency front-end circuit according to claim 11, wherein the high-acoustic-velocity member is a high-acoustic-vlocity supporting substrate.

20. A communication apparatus comprising:
the frequency front-end circuit according to claim 11; and
an RF signal processing circuit.

* * * * *